United States Patent
Achuthan et al.

(12) 
(10) Patent No.: US 6,498,093 B1
(45) Date of Patent: Dec. 24, 2002

(54) FORMATION WITHOUT VACUUM BREAK OF SACRIFICIAL LAYER THAT DISSOLVES IN ACIDIC ACTIVATION SOLUTION WITHIN INTERCONNECT

(75) Inventors: Krishnashree Achuthan, San Ramon, CA (US); Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/052,133

(22) Filed: Jan. 17, 2002

(51) Int. Cl.$^7$ .......................................... H01L 21/4763
(52) U.S. Cl. ..................... 438/643; 438/687; 438/644; 438/645; 438/678; 438/627; 438/628; 438/648
(58) Field of Search ................................ 438/687, 644, 438/643, 645, 678, 628, 648, 627

(56) References Cited

U.S. PATENT DOCUMENTS

| | | | |
|---|---|---|---|
| 5,517,758 A | * | 5/1996 | Nakamura |
| 5,824,599 A | | 10/1998 | Schacham-Diamand .... 438/678 |
| 5,968,333 A | * | 10/1999 | Nogami et al. |
| 5,969,422 A | * | 10/1999 | Ting et al. |
| 5,972,192 A | * | 10/1999 | Dubin et al. |
| 6,022,808 A | * | 2/2000 | Nogami et al. |
| 6,162,726 A | * | 12/2000 | Dubin |
| 6,249,055 B1 | * | 6/2001 | Dubin |
| 6,268,289 B1 | * | 7/2001 | Chowdhury et al. |
| 6,420,258 B1 | * | 7/2002 | Chen et al. |

\* cited by examiner

*Primary Examiner*—Long Pham
(74) *Attorney, Agent, or Firm*—Monica H. Choi

(57) ABSTRACT

For filling an interconnect opening of an integrated circuit formed on a semiconductor substrate, an underlying material is formed at any exposed walls of the interconnect opening. A sacrificial layer of protective material is formed on the underlying material at the walls of the interconnect opening. The underlying material and the sacrificial layer of protective material are formed without a vacuum break. The protective material of the sacrificial layer is soluble in an acidic catalytic solution used for depositing a catalytic seed layer. The semiconductor substrate having the interconnect opening is placed within an acidic catalytic solution for depositing a catalytic seed layer. The sacrificial layer of protective material is dissolved away from the underlying material by the acidic catalytic solution such that the underlying material is exposed to the acidic catalytic solution. A catalytic seed layer formed from the acidic catalytic solution is deposited on the exposed underlying material at the walls of the interconnect opening. The conductive fill for filling the interconnect opening is grown from the catalytic seed layer by electroless deposition. The present invention may be used to particular advantage when the underlying material is comprised of tantalum as a diffusion barrier material, and when the protective material of the sacrificial layer is comprised of magnesium. In that case, the acidic catalytic solution includes palladium chloride and/or tin chloride with hydrochloric acid for dissolving the sacrificial layer of protective material.

12 Claims, 9 Drawing Sheets

FORMATION WITHOUT VACUUM BREAK OF SACRIFICIAL LAYER THAT DISSOLVES IN ACIDIC ACTIVATION SOLUTION WITHIN INTERCONNECT

TECHNICAL FIELD

The present invention relates generally to fabrication of interconnect structures within integrated circuits, and more particularly, to formation of a sacrificial layer on an underlying material within an interconnect opening without a vacuum break, with the sacrificial layer dissolving away in an acidic activation solution used for formation of a catalytic seed layer on the underlying material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded of metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Figure 1:
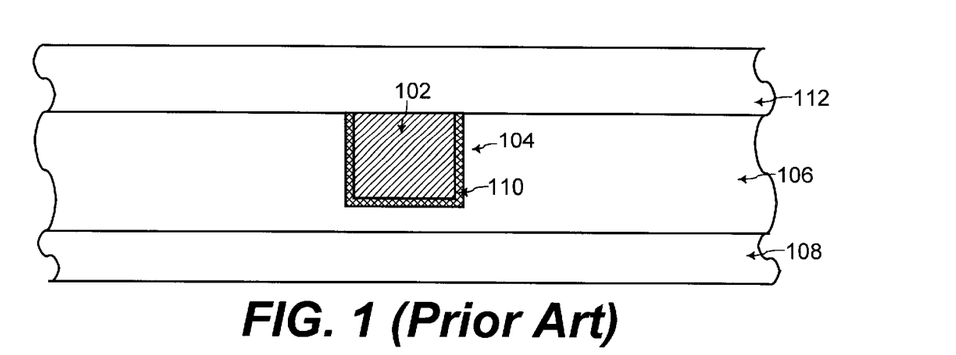
FIG. 1 shows a cross-sectional view of a copper interconnect formed by copper filling a trench within an insulating layer, according to the prior art.

Referring to FIG. 1, a cross sectional view is shown of a copper interconnect 102 within a trench 104 formed in an insulating layer 106. The copper interconnect 102 within the insulating layer 106 is formed on a semiconductor wafer 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Figure 2:
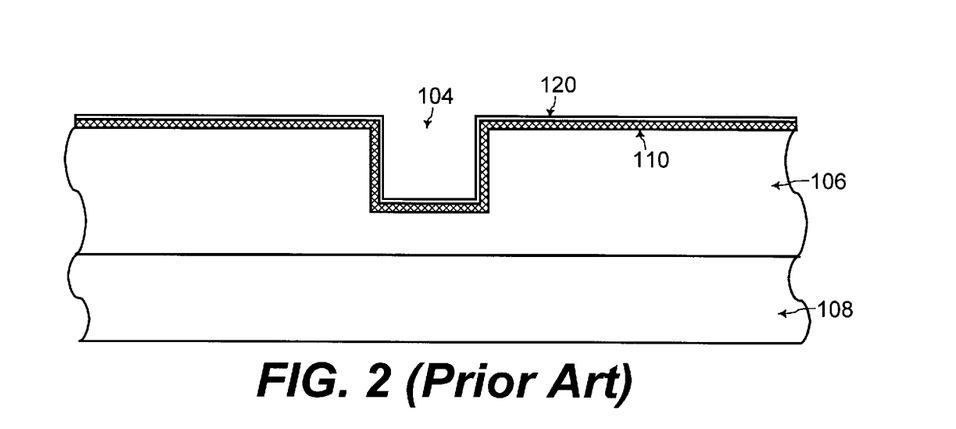
FIGS. 2, 3, 4, and 5 show cross-sectional views of an interconnect structure with an undesired oxide layer formed on a diffusion barrier material, according to the prior art.

Referring to FIG. 2, typically for filling the trench 104 with copper, the diffusion barrier material 110 is deposited on the sidewalls and the bottom wall of the trench 104. When the diffusion barrier material 110 is exposed to oxygen, such as oxygen gas in air for example, the diffusion barrier material 110 may oxidize to form an undesired oxide layer 120. For example, when the diffusion barrier material 110 is comprised of tantalum, the undesired oxide layer 120 is comprised of tantalum oxide ($Ta_2O_5$) that is formed from oxidation of the exposed surfaces of the diffusion barrier material 110.

Figure 3:
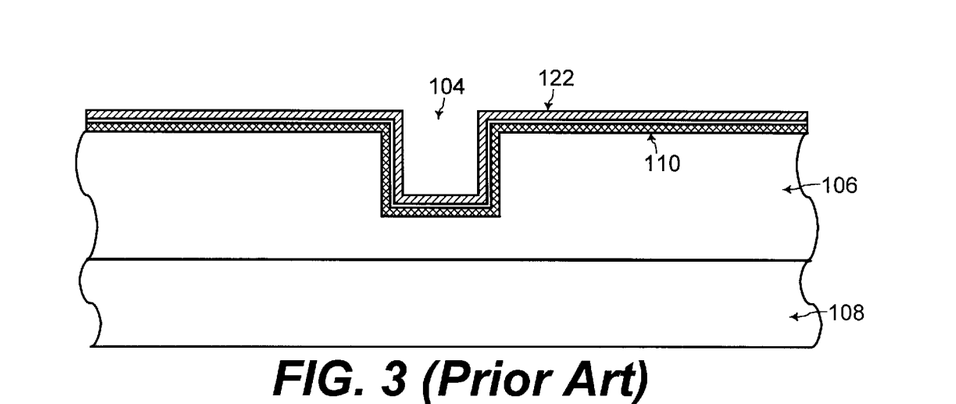
Figure 4:
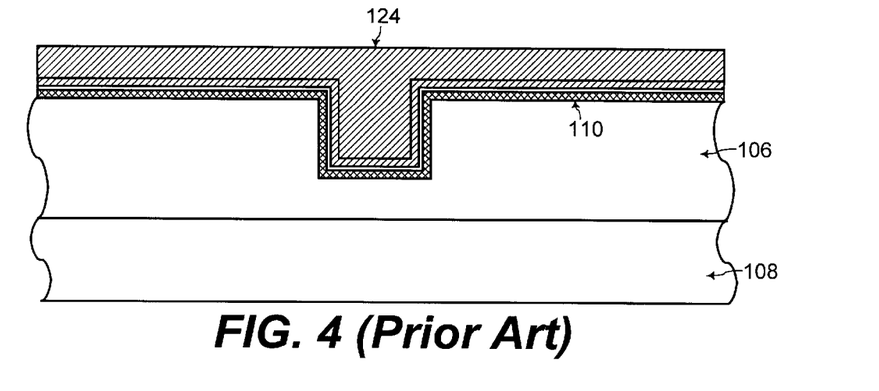
Figure 5:
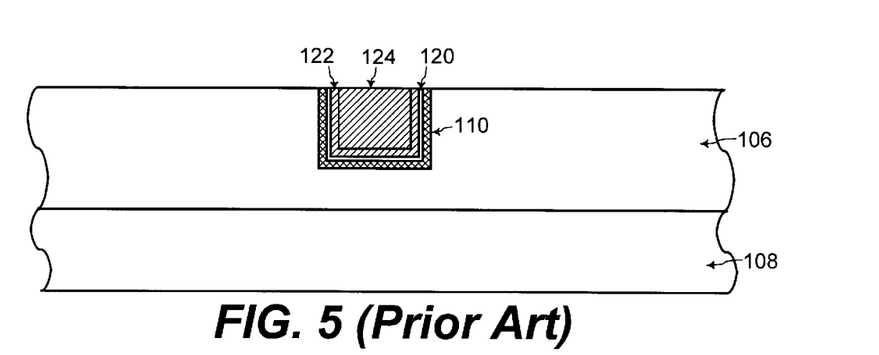

Referring to FIG. 3, before electroless deposition of copper for filling the trench 104, a catalytic seed layer 122 is deposited on any exposed surfaces. With formation of the undesired oxide layer 120, the catalytic seed layer 122 is deposited on the undesired oxide layer 120. Referring to FIG. 4, the copper fill 124 is electrolessly deposited from the catalytic seed layer 122 to fill the trench opening 104. Referring to FIG. 5, the portions of the copper fill 124, the catalytic seed layer 122, the undesired oxide layer 120, and the diffusion barrier material 110 disposed on the surrounding insulating layer 106 are polished away in a CMP (chemical mechanical polishing) process such that the copper fill 124, the catalytic seed layer 122, the undesired oxide layer 120, and the diffusion barrier material 110 are contained within the trench 104.

In the prior art interconnect structure as illustrated in FIGS. 2, 3, 4, and 5, the undesired oxide layer 120 disposed between the diffusion barrier material 110 and the catalytic seed layer 122 degrades the performance of the interconnect structure. The catalytic seed layer 122 may have poor adhesion to the undesired oxide layer 120 to promote electromigration failure of the interconnect structure. In addition, the undesired oxide layer 120 may be non-conductive to insulate the conductive diffusion barrier material 110 from enhancing the conductivity of the interconnect structure. Such features are especially disadvantageous for interconnect structures having higher aspect ratio (defined as a ratio of the depth to the width of the interconnect structure).

Thus, as integrated circuit dimensions including the width of the interconnect structures are further scaled down, a mechanism is desired for eliminating the undesired oxide layer 120 from the interconnect structure. In addition, preservation of any dielectric material of the integrated circuit having the interconnect structure is desired while eliminating the undesired oxide layer 120 from the interconnect structure.

SUMMARY OF THE INVENTION

Accordingly, in a general aspect of the present invention, a sacrificial layer of protective material is formed on an underlying material, such as the diffusion barrier material, to prevent oxidation of the underlying material.

In one embodiment of the present invention, in a system and method for filling an interconnect opening of an integrated circuit formed on a semiconductor substrate, an underlying material is formed at any exposed walls of the interconnect opening. A sacrificial layer of protective material is formed on the underlying material at the walls of the interconnect opening. The underlying material and the sacrificial layer of protective material are formed without a vacuum break. The protective material of the sacrificial layer is soluble in an acidic catalytic solution used for depositing a catalytic seed layer. The semiconductor substrate having the interconnect opening is placed within an acidic catalytic solution for depositing a catalytic seed layer. The sacrificial layer of protective material is dissolved away from the underlying material by the acidic catalytic solution such that the underlying material is exposed to the acidic catalytic solution. A catalytic seed layer formed from the acidic catalytic solution is deposited on the exposed underlying material at the walls of the interconnect opening.

According to another embodiment of the present invention, the semiconductor substrate having the interconnect opening is placed within an electroless deposition solution for filling the interconnect opening by growing a conductive fill material from the catalytic seed layer using the electroless deposition solution.

The present invention may be used to particular advantage when the underlying material is comprised of a diffusion barrier material, such as tantalum, and when the protective material of the sacrificial layer is comprised of magnesium. In that case, the acidic catalytic solution includes palladium chloride and/or tin chloride with hydrochloric acid for depositing the catalytic seed layer comprised of palladium and/or tin on the underlying material.

In this manner, the underlying material is covered by the sacrificial layer of protective material until the semiconductor substrate is immersed in the acidic catalytic solution for forming the catalytic seed layer. Thus, the underlying material is not exposed to oxygen such that an undesired oxide layer is not formed on the underlying material. The sacrificial layer of protective material dissolves away from the underlying material when the semiconductor substrate is immersed in the acidic catalytic solution such that the catalytic seed layer is deposited directly on the underlying material. The acidic catalytic solution does not deleteriously etch or otherwise degrade any dielectric material already formed for the integrated circuit on the semiconductor substrate.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

The present invention is described for formation of copper interconnect. However, the present invention may be practiced for eliminating an undesired oxide layer by forming a sacrificial layer of protective material that dissolves away in an acidic catalytic solution for other types of interconnects, as would be apparent to one of ordinary skill in the art of integrated circuit fabrication from the description herein.

Figure 6:
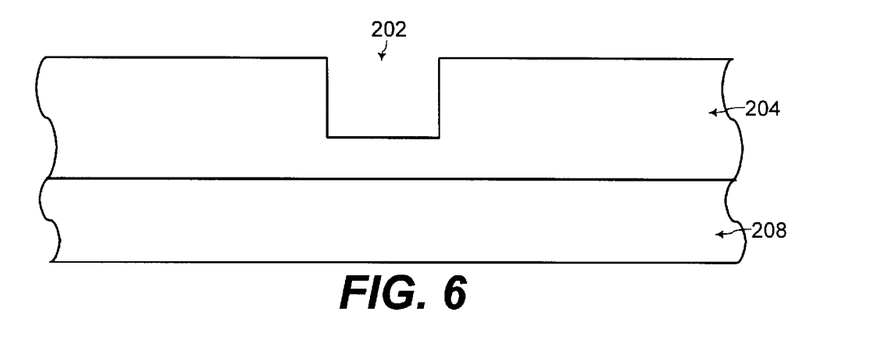
FIGS. 6, 7, 8, 9, and 10 show cross-sectional views of an interconnect structure with a sacrificial layer of protective material formed on a underlying diffusion barrier material to prevent formation of an undesired oxide layer on the underlying diffusion barrier material, according to an embodiment of the present invention.

Referring to FIG. 6, for forming an interconnect such as copper interconnect, an interconnect opening 202 such as a trench line is formed within an insulating layer 204 on a semiconductor wafer 208 as part of an integrated circuit, as known to one of ordinary skill in the art of integrated circuit fabrication. Typically, the semiconductor wafer 208 is comprised of silicon (Si), and the insulating layer 204 is comprised of silicon dioxide ($SiO_2$) or a low dielectric constant insulating material such as organic doped silica, as known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the interconnect opening 202 within the insulating layer 204 and then filling the interconnect opening 202 with copper fill.

Figure 7:
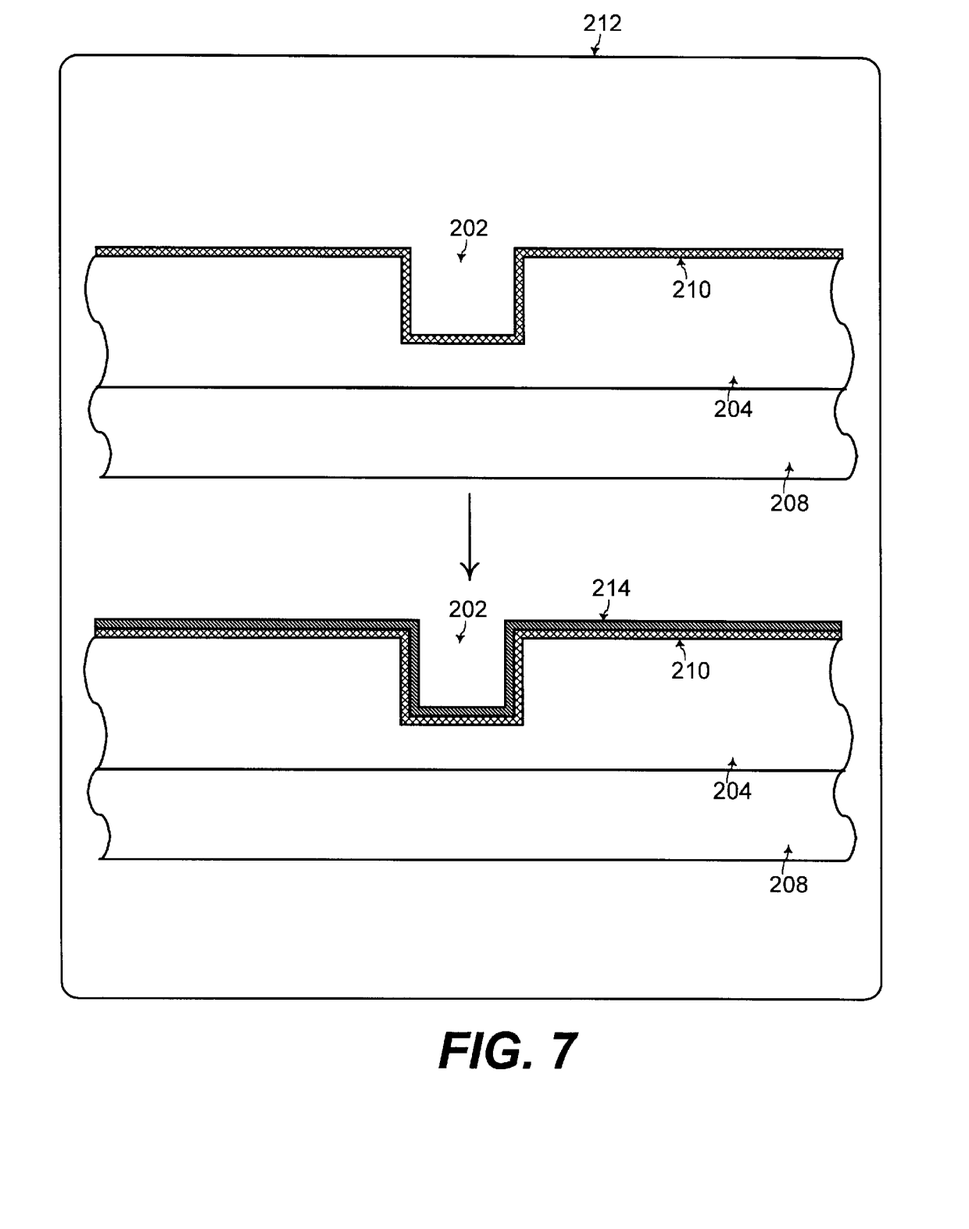

Referring to FIG. 7, a diffusion barrier material 210 is deposited on the exposed surfaces of the insulating layer 204 including the sidewalls and the bottom wall of the interconnect opening 202. Referring to FIG. 7, the insulating layer 204 is typically comprised of silicon dioxide or a low dielectric constant insulating material such as organic doped silica, as known to one of ordinary skill in the art of integrated circuit fabrication, especially when the semiconductor wafer 208 is a silicon substrate. Copper may easily diffuse into the insulating layer 204, and this diffusion of copper may degrade the performance of the integrated circuit. Thus, the diffusion barrier material 210 is deposited to surround the copper to be filled within the interconnect opening 202.

The diffusion barrier material 210 prevents diffusion of copper to be filled within the interconnect opening 202 to the insulating layer 204 to preserve the integrity of the insulating layer 204. The diffusion barrier material 210 may be a diffusion barrier metal or a diffusion barrier dielectric. Such diffusion barrier materials and processes for deposition of such diffusion barrier materials are known to one of ordinary skill in the art of integrated circuit fabrication.

For example, the diffusion barrier material 210 is comprised of tantalum according to one embodiment of the present invention. If the semiconductor substrate 208 having the tantalum diffusion barrier material 210 were exposed to a source of oxygen, such as air, then the tantalum of the diffusion barrier material 210 is oxidized to form an undesired layer of tantalum oxide ($Ta_2O_5$) on the diffusion barrier material 210. According to an aspect of the present invention, the diffusion barrier material 210 is an underlying material formed within a vacuum chamber 212. The vacuum chamber 212 is controlled such that substantially zero oxygen is present within the vacuum chamber 212. Such a vacuum chamber is known to one of ordinary skill in the art of integrated circuit fabrication. Such a vacuum chamber may be for a deposition chamber or for a deposition cluster tool, as known to one of ordinary skill in the art of integrated circuit fabrication.

Because the diffusion barrier material 210 is formed within the vacuum chamber 212, the diffusion barrier material 210 is not exposed to oxygen, and an undesired oxide layer is not formed on the diffusion barrier material 210. Further referring to FIG. 7, according to an aspect of the present invention, a sacrificial layer of protective material 214 is formed on the underlying diffusion barrier material 210 within the vacuum chamber 212 without a vacuum break after the diffusion barrier material 210 is formed. Thus, the diffusion barrier material 210 is not exposed to oxygen between formation of the diffusion barrier material 210 and formation of the sacrificial layer of protective material 214 on the diffusion barrier material 210. For example, the sacrificial layer of protective material 214 is formed on the diffusion barrier material 210 within the same vacuum chamber 212 shortly after formation of the diffusion barrier material 210 within the vacuum chamber 212.

In one embodiment of the present invention, the sacrificial layer of protective material 214 is comprised of magnesium when the diffusion barrier material 210 is comprised of tantalum. Processes for depositing such sacrificial layer of protective material 214 and diffusion barrier material 210 without a vacuum break are known to one of ordinary skill in the art of integrated circuit fabrication. In this manner, the sacrificial layer of protective material 214 covers the underlying diffusion barrier material 210 without formation of an undesired layer of oxide from oxidation of the underlying diffusion barrier material 210. With the sacrificial layer of protective material 214 covering the underlying diffusion barrier material 210, the semiconductor substrate 208 may be handled in air without formation of an undesired layer of oxide from oxidation of the underlying diffusion barrier material 210. The sacrificial layer of protective material 214 prevents oxygen from reaching the underlying diffusion barrier material 210.

Figure 8:
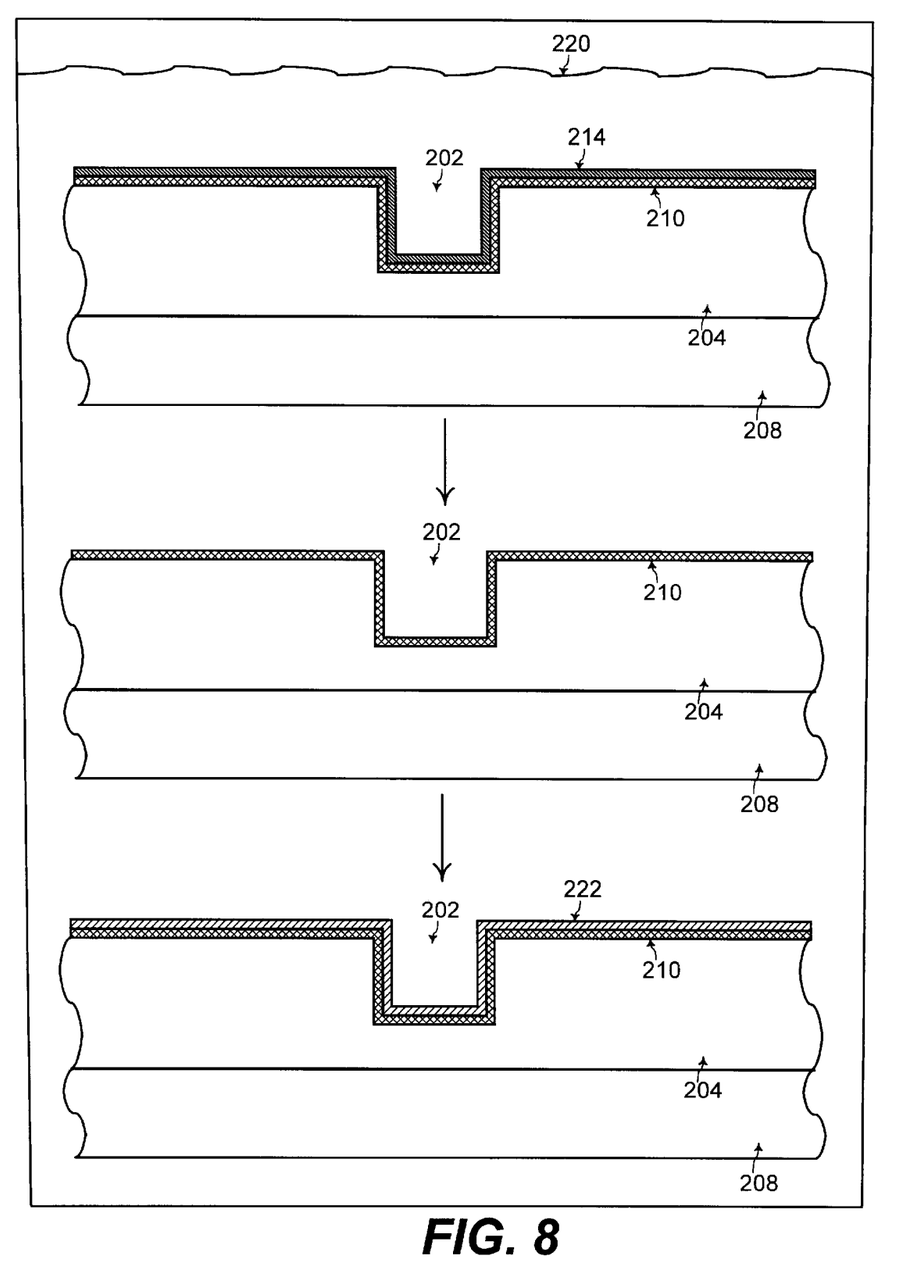

Referring to FIG. 8, the semiconductor substrate 208 is placed within an acidic catalytic solution 220 for forming a catalytic seed layer. Referring to FIG. 8, according to an aspect of the present invention, the sacrificial layer of protective material 214 is soluble in the acidic catalytic solution 220. For example, in one embodiment of the present invention, when the underlying diffusion barrier material 210 is comprised of tantalum and the sacrificial layer of protective material 214 is comprised of magnesium, the acidic catalytic solution 220 is comprised of palladium chloride ($PdCl_2$) and/or tin chloride ($SnCl_2$) including hydrochloric acid (HCl). Such an acidic catalytic solution 220 is commercially available and known to one of ordinary skill in the art of integrated circuit fabrication. The sacrificial layer of protective material 214 comprised of magnesium is soluble in the acidic catalytic solution 220 having hydrochloric acid (HCl).

FIG. 8 illustrates cross-sectional views of the interconnect opening 202 in time-sequence. When the semiconductor substrate 208 having the sacrificial layer of protective material 214 on the underlying diffusion barrier material 210 is immersed within the acidic catalytic solution 220, the sacrificial layer of protective material 214 is dissolved away by the acidic catalytic solution 220 from the underlying diffusion barrier material 210 (as shown from the top cross section to the middle cross section in FIG. 8. In addition, the acidic catalytic solution 220 does not deleteriously etch or otherwise degrade any dielectric material already formed for the integrated circuit on the semiconductor substrate.

In addition, after the sacrificial layer of protective material 214 is dissolved away from the underlying diffusion barrier material 210, a catalytic seed layer 222 is formed on the underlying diffusion barrier material 210 (as shown from the middle cross section to the bottom cross section in FIG. 8). In one embodiment of the present invention, when the underlying diffusion barrier material 210 is comprised of tantalum, the sacrificial layer of protective material 214 is comprised of magnesium, and the acidic catalytic solution 220 is comprised of palladium chloride ($PdCl_2$), the catalytic seed layer 222 is comprised of palladium.

Similarly, when the underlying diffusion barrier material 210 is comprised of tantalum, the sacrificial layer of protective material 214 is comprised of magnesium, and the acidic catalytic solution 220 is comprised of tin chloride ($SnCl_2$), the catalytic seed layer 222 is comprised of tin. Alternatively, when the underlying diffusion barrier material 210 is comprised of tantalum, the sacrificial layer of protective material 214 is comprised of magnesium, and the acidic catalytic solution 220 is comprised of palladium chloride ($PdCl_2$) and tin chloride ($SnCl_2$), the catalytic seed layer 222 is comprised of a compound of palladium and tin.

Figure 9:
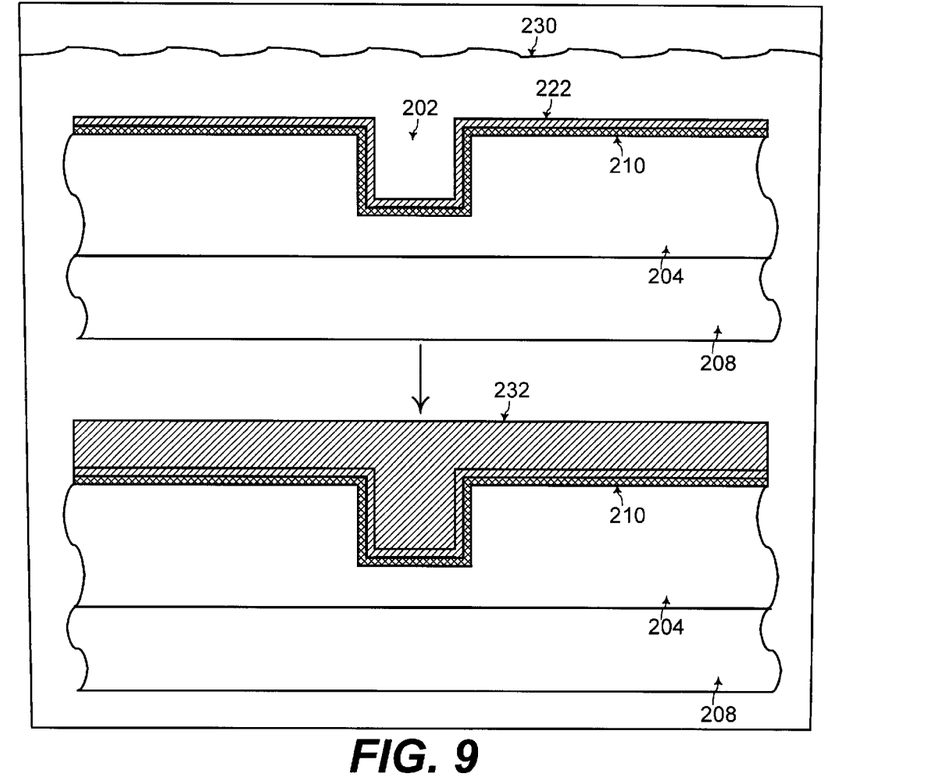

Referring to FIG. 9, after formation of the catalytic seed layer 222 on the underlying diffusion barrier material 210, the semiconductor substrate 208 is immersed in an electroless deposition solution 230 for filling the interconnect opening 202 with a conductive fill material 232 such as copper. For example, copper from the electroless deposition solution 230 grows from the catalytic seed layer 222 comprised of palladium and/or tin according to one embodiment of the present invention. Such electroless deposition solution is commercially available and known to one of ordinary skill in the art of integrated circuit fabrication.

Figure 10:
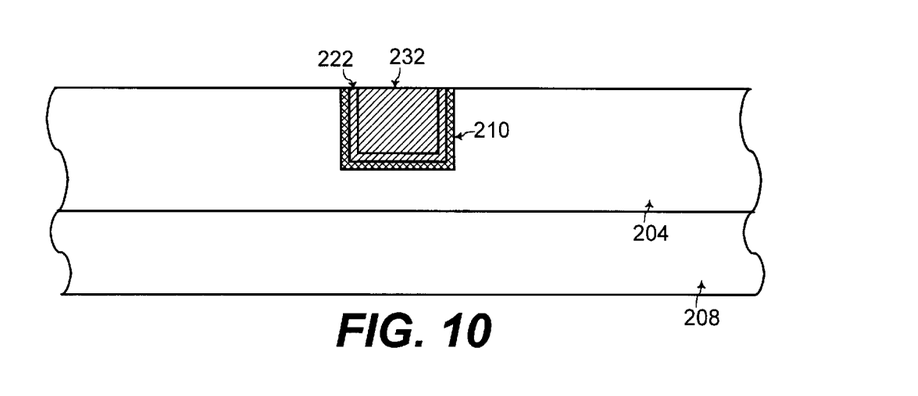

Referring to FIG. 10, the copper fill 232, the catalytic seed layer 222, and the diffusion barrier material 210 on the insulating layer 204 are polished down until the insulating layer 204 is exposed such that the copper fill 232, the catalytic seed layer 222, and the diffusion barrier material 210 are contained within the interconnect opening 202. Polishing processes such as CMP (chemical mechanical polishing) processes for polishing away the copper fill 232, the catalytic seed layer 222, and the diffusion barrier material 210 from the insulating layer 204 are known to one of ordinary skill in the art of integrated circuit fabrication.

In this manner, the underlying diffusion barrier material 210 is covered by the sacrificial layer of protective material 214 until the semiconductor substrate 208 is immersed in the acidic catalytic solution 220 for forming the catalytic seed layer 222 on the underlying diffusion barrier material 210. Thus, the underlying diffusion barrier material 210 is not exposed to oxygen such that an undesired oxide layer is not formed on the underlying diffusion barrier material 210. The sacrificial layer of protective material 214 dissolves away from the underlying diffusion barrier material 210 when the semiconductor substrate 208 is immersed in the acidic catalytic solution 220 such that the catalytic seed layer 222 is deposited directly on the underlying diffusion barrier material 210. In addition, the acidic catalytic solution 220 does not deleteriously etch or otherwise degrade any dielectric material already formed for the integrated circuit on the semiconductor substrate.

Without formation of the undesired oxide layer between the catalytic seed layer 222 and the underlying diffusion barrier material 210, the catalytic seed layer 222 has a stronger adhesion to the underlying diffusion barrier material 210 to improve the reliability of the interconnect structure. Furthermore, without formation of the undesired oxide layer, when the diffusion barrier material 210 is comprised of a conductive material, the volume of the diffusion barrier material 210 may enhance the conductivity of the interconnect structure. Such features are especially advantageous for interconnect structures with high aspect ratio as the dimensions of the interconnect structures are scaled down.

Figure 11:
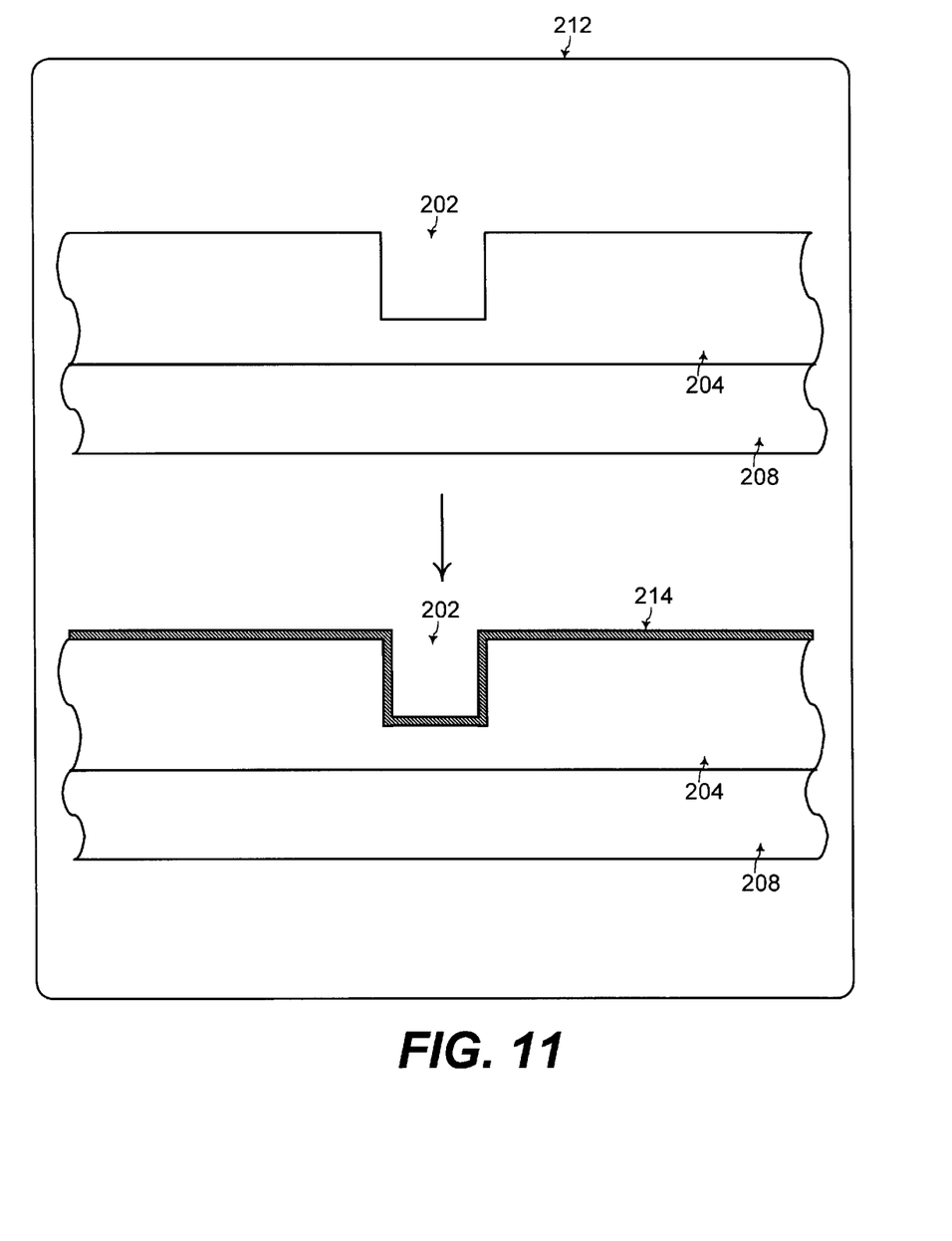
FIGS. 11, 12, 13, and 14 show cross-sectional views of an interconnect structure with a sacrificial layer of protective material formed on a dielectric material, according to another embodiment of the present invention.

Referring to FIG. 11, in an alternative embodiment of the present invention, the sacrificial layer of protective material 214 is formed on the dielectric material of the insulating layer 204 when a diffusion barrier material is not used. For example, with advancement of technology for dielectric materials, the insulating layer 204 may be comprised of an insulating material that is impervious to copper diffusion such that a diffusion barrier material is not used. Alternatively, the insulating material 204 may be comprised of silicon dioxide or a low dielectric constant insulating material such as organic doped silica.

In one aspect of the present invention, the exposed surfaces of the interconnect opening 202 and the sacrificial layer of protective material 214 are formed within the same vacuum chamber 212 without a vacuum break. Thus, the underlying dielectric material of the insulating layer 204 that is covered by the sacrificial layer of protective material 214 is protected from exposure to any deleterious elements or compounds in the air.

Figure 12:
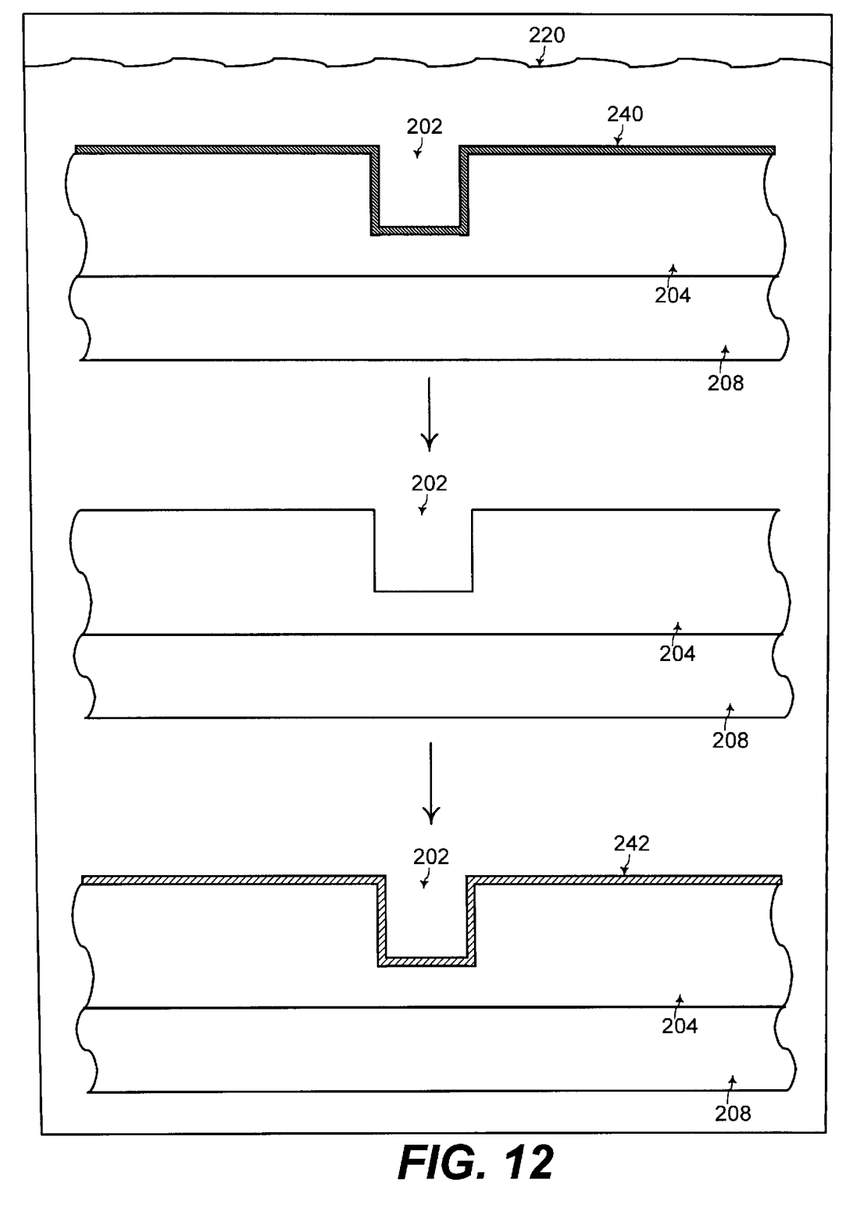

Referring to FIG. 12, the semiconductor substrate 208 is placed within the acidic catalytic solution 220 for forming a catalytic seed layer. FIG. 12 illustrates cross-sectional views of the interconnect opening 202 in time-sequence. When the semiconductor substrate 208 having the sacrificial layer of protective material 214 on the underlying dielectric material of the insulating layer 204 is immersed within the acidic catalytic solution 220, the sacrificial layer of protective material 214 is dissolved away by the acidic catalytic solution 220 from the underlying dielectric material of the insulating layer 204 (as shown from the top cross section to the middle cross section in FIG. 12). In addition, the acidic catalytic solution 220 does not deleteriously etch or otherwise degrade any dielectric material already formed for the integrated circuit on the semiconductor substrate.

In addition, after the sacrificial layer of protective material 214 is dissolved away from the underlying dielectric material of the insulating layer 204, a catalytic seed layer 242 is formed on the underlying dielectric material of the insulating layer 204 (as shown from the middle cross section to the bottom cross section in FIG. 12). In one embodiment of the present invention, when the sacrificial layer of protective material 214 is comprised of magnesium and the acidic catalytic solution 220 is comprised of palladium chloride ($PdCl_2$) including hydrochloric acid (HCl), the catalytic seed layer 242 is comprised of palladium.

Similarly, when the sacrificial layer of protective material 214 is comprised of magnesium and the acidic catalytic solution 220 is comprised of tin chloride ($SnCl_2$), the catalytic seed layer 222 is comprised of tin. Alternatively, when the sacrificial layer of protective material 214 is comprised of magnesium and the acidic catalytic solution 220 is comprised of palladium chloride ($PdCl_2$) and tin chloride ($SnCl_2$), the catalytic seed layer 222 is comprised of a compound of palladium and tin.

Figure 13:
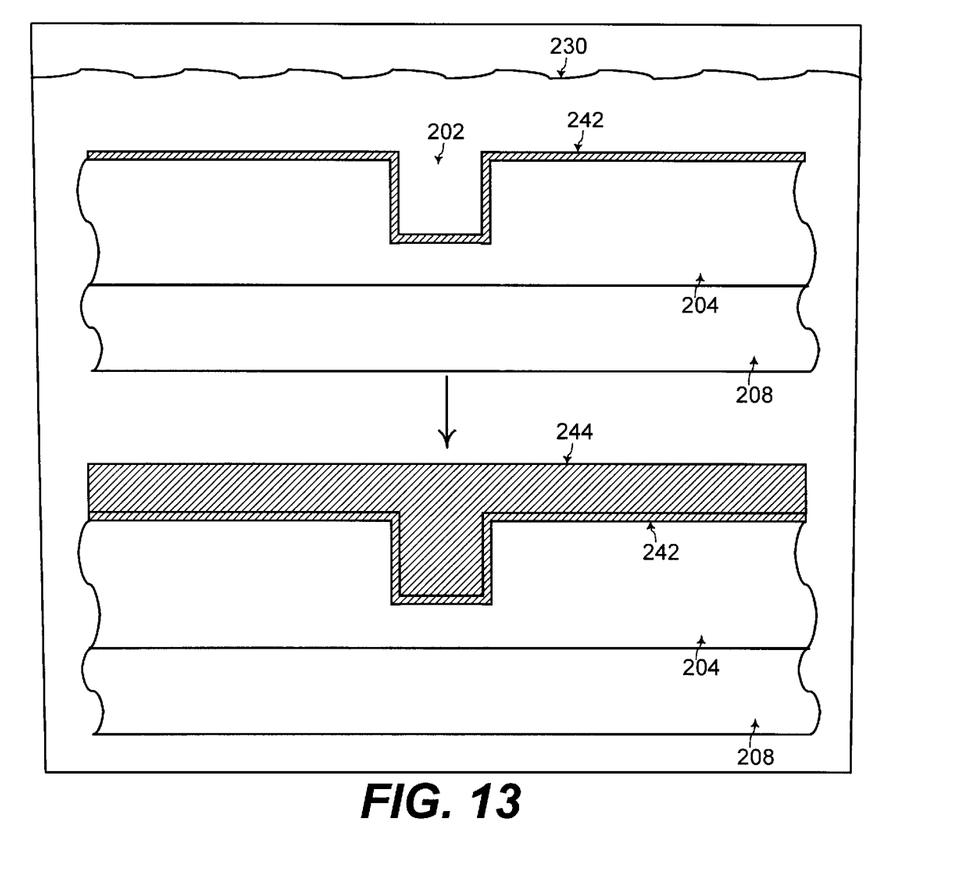

Referring to FIG. 13, after formation of the catalytic seed layer 242 on the underlying dielectric material of the insulating layer 204, the semiconductor substrate 208 is immersed in an electroless deposition solution for filling the interconnect opening 202 with a conductive fill material 244 such as copper. For example, copper from the electroless deposition solution grows from the catalytic seed layer 242 comprised of palladium and/or tin according to one embodiment of the present invention. Such electroless deposition solution is commercially available and known to one of ordinary skill in the art of integrated circuit fabrication.

Figure 14:
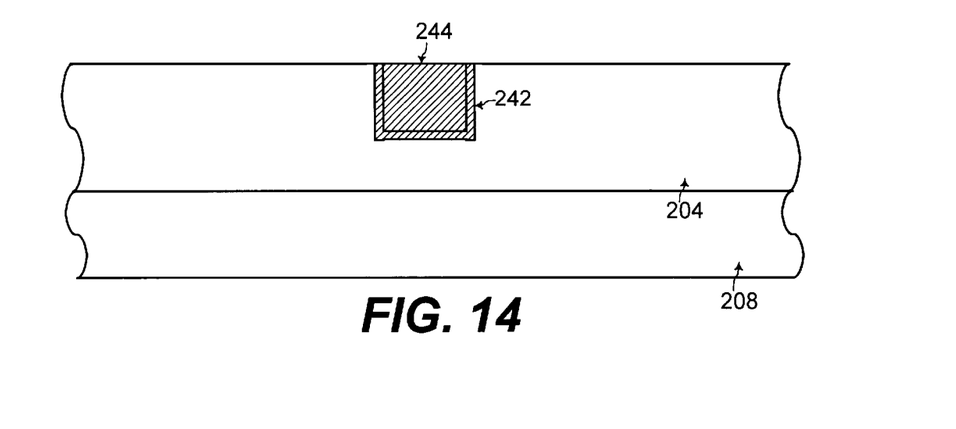
Figure 15:
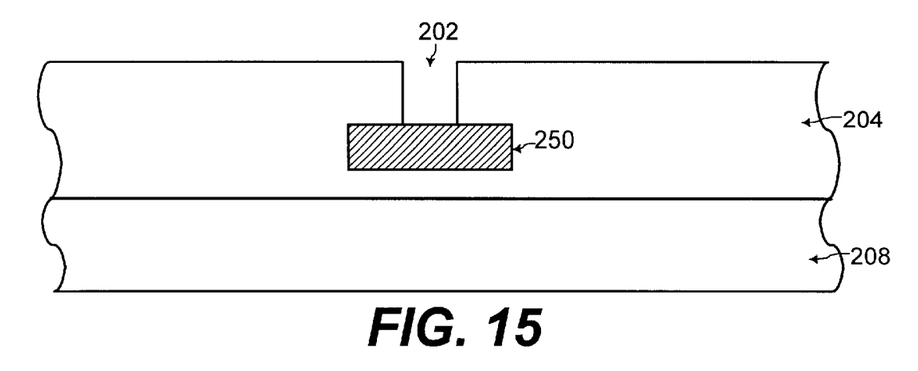
FIG. 15 shows a cross-sectional view of a via hole formed on a bottom interconnect structure.
Figure 16:
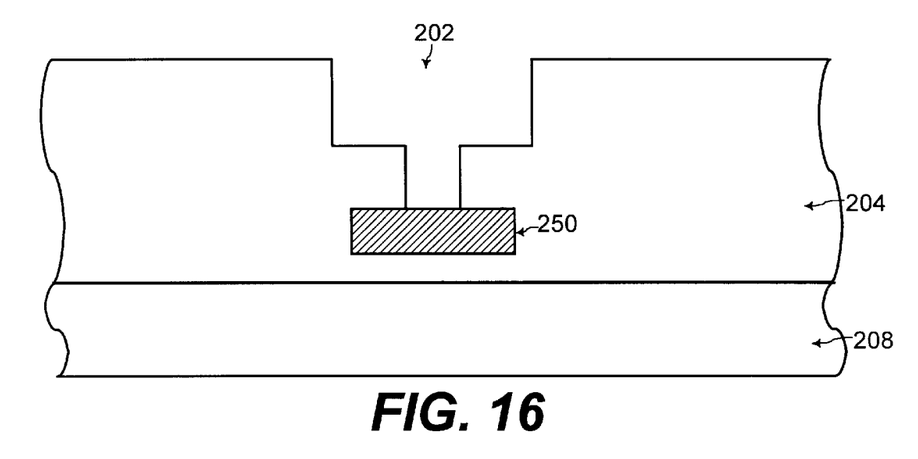
FIG. 16 shows a cross-sectional view of a dual damascene opening formed on a bottom interconnect structure.

Referring to FIG. 14, the copper fill 244 and the catalytic seed layer 222 on the insulating layer 204 are polished down until the insulating layer 204 is exposed such that the copper fill 244 and the catalytic seed layer 242 are contained within the interconnect opening 202. Polishing processes such as CMP (chemical mechanical polishing) processes for polishing away the copper fill 244 and the catalytic seed layer 242 from the insulating layer 204 are known to one of ordinary skill in the art of integrated circuit fabrication.

The foregoing is by way of example only and is not intended to be limiting. For example, the present invention is described for formation of copper interconnect. However, the present invention may be practiced for eliminating an undesired layer by forming a sacrificial layer of protective material that dissolves away in an acidic catalytic solution for other types of interconnects, as would be apparent to one of ordinary skill in the art of integrated circuit fabrication from the description herein.

In addition, the present invention is described for the underlying diffusion barrier material 210 and the underlying dielectric material of the insulating layer 204. However, the present invention may be practiced for preventing formation of an undesired material on any type of underlying material at the walls within an interconnect opening, as would be apparent to one of ordinary skill in the art of integrated circuit fabrication from the description herein.

Furthermore, the interconnect opening 202 is illustrated as a trench line for forming a metal line as the interconnect structure. However, referring to FIG. 15, the present invention may be practiced when the interconnect opening 202 is a via hole for providing connection to a bottom interconnect structure 250, as would be apparent to one of ordinary skill in the art of integrated circuit fabrication from the description herein. Additionally, referring to FIG. 16, the present invention may be practiced when the interconnect opening 202 is a dual damascene opening 202 for providing connection to the bottom interconnect structure 250 and for forming a top interconnect structure, as would be apparent to one of ordinary skill in the art of integrated circuit fabrication from the description herein. Via holes and dual damascene openings are known to one of ordinary skill in the art of integrated circuit fabrication.

Furthermore, as will be understood by those skilled in the art, the structures described herein may be made or used in the same way regardless of their position and orientation. Accordingly, it is to be understood that terms and phrases such as "top," "bottom," and "sidewall" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for filling an interconnect opening of an integrated circuit formed on a semiconductor substrate, the method comprising the steps of:
   A. forming an underlying material at any exposed walls of said interconnect opening;
   B. forming a sacrificial layer of protective material on said underlying material at said walls of said interconnect opening;
      wherein said step A and said step B are performed without a vacuum break between said step A and said step B;
      and wherein said protective material of said sacrificial layer is soluble in an acidic catalytic solution used for depositing a catalytic seed layer;
   C. immersing said semiconductor substrate having said interconnect opening within an acidic catalytic solution for depositing a catalytic seed layer after said steps A and B;
      wherein said sacrificial layer of protective material is dissolved away from said underlying material by said acidic catalytic solution such that said underlying material is exposed to said acidic catalytic solution; and
   D. depositing a catalytic seed layer formed from said acidic catalytic solution on said exposed underlying material at said walls of said interconnect opening while said semiconductor substrate is immersed within said acidic catalytic solution during said step C;
      wherein said sacrificial layer of protective material is dissolved away and said catalytic seed layer is formed on said underlying material all the while said semiconductor substrate is immersed within said same acidic catalytic solution during said step C.

2. The method of claim 1, further comprising the step of:
   placing said semiconductor substrate having said interconnect opening within an electroless deposition solution for filling said interconnect opening by growing a conductive fill material from said catalytic seed layer using said electroless deposition solution, after said step D.

3. The method of claim 1, wherein said underlying material is comprised of a diffusion barrier material.

4. The method of claim 3, wherein said underlying material is comprised of tantalum.

5. The method of claim 4, wherein said protective material of said sacrificial layer is comprised of magnesium.

6. The method of claim 1, wherein said underlying material is comprised of a dielectric material surrounding said interconnect opening.

7. The method of claim 1, wherein said protective material of said sacrificial layer is comprised of magnesium.

8. The method of claim 1, wherein said acidic catalytic solution includes palladium chloride with hydrochloric acid for depositing said catalytic seed layer comprised of palladium on said underlying material.

9. The method of claim 1, wherein said acidic catalytic solution includes tin chloride with hydrochloric acid for depositing said catalytic seed layer comprised of tin on said underlying material.

10. The method of claim 1, wherein said acidic catalytic solution includes palladium chloride and tin chloride with hydrochloric acid for depositing said catalytic seed layer comprised of a compound of palladium and tin on said underlying material.

11. The method of claim 1, wherein said interconnect opening is one of a trench line, a via hole, or a dual damascene interconnect opening.

12. A method for filling an interconnect opening of an integrated circuit formed on a semiconductor substrate, the method comprising the steps of:
   A. forming an underlying material at any exposed walls of said interconnect opening;
      wherein said interconnect opening is one of a trench line, a via hole, or a dual damascene interconnect opening;
      and wherein said underlying material is comprised of tantalum as a diffusion barrier material;
   B. forming a sacrificial layer of protective material on said underlying material at said walls of said interconnect opening;
      wherein said protective material of said sacrificial layer is comprised of magnesium;
      wherein said step A and said step B are performed without a vacuum break between said step A and said step B;
      and wherein said protective material of said sacrificial layer is soluble in an acidic catalytic solution used for depositing a catalytic seed layer;
   C. immersing said semiconductor substrate having said interconnect opening within an acidic catalytic solution for depositing a catalytic seed layer after said steps A and B;
      wherein said sacrificial layer of protective material is dissolved away from said underlying material by said acidic catalytic solution such that said underlying material is exposed to said acidic catalytic solution;
   D. depositing a catalytic seed layer formed from said acidic catalytic solution on said exposed underlying material at said walls of said interconnect opening while said semiconductor substrate is immersed within said acidic catalytic solution during said step C;
      wherein said acidic catalytic solution includes palladium chloride and tin chloride with hydrochloric acid for depositing said catalytic seed layer comprised of a compound of palladium and tin on said underlying material;
      and wherein said sacrificial layer of protective material is dissolved away and said catalytic seed layer is formed on said underlying material all the while said semiconductor substrate is immersed within said same acidic catalytic solution during said step C; and
   E. immersing said semiconductor substrate having said interconnect opening within an electroless deposition solution for filling said interconnect opening by growing copper from said catalytic seed layer using said electroless deposition solution, after said step D.

* * * * *